March 27, 1962 AKIHIKO SATO 3,027,503

TRANSISTOR

Filed Dec. 8, 1959

INVENTOR
AKIHIKO SATO
BY Mitchell & Bechert
ATTORNEYS

United States Patent Office 3,027,503

Patented Mar. 27, 1962

3,027,503

TRANSISTOR

Akihiko Sato, Tokyo, Japan, assignor to Nippon Electric Company Limited, Tokyo, Japan, a corporation of Japan Filed Dec. 8, 1959, Ser. No. 858,246
5 Claims. (Cl. 317—235)

This invention relates to a transistor, and more particularly to a novel construction of a power transistor.

The utility or application of a transistor has been restricted, because intrinsically it has a small power output in comparison with a vacuum tube. The small power output may be attributable to two causes: first, as the number of minority carriers injected by the emitter of a transistor increases, the specific resistivity of the base region decreases and as a result, the emitter injection efficiency decreases; and second, inasmuch as the base current of a power transistor is considerably large, a significant voltage drop is produced by the base current flowing towards the base terminal. As a result, a forward voltage difference over a part of the emitter base region becomes small so that in such part the minority carriers are not injected. In other words, a part of the emitter does not serve the function of an emitter.

Of the above-mentioned two points, the first point may be solved by making the base region of a material having small specific resistivity. The second point is, however, much more serious than the first. One proposal to improve this "partial" emitter operation has been to form the base in the shape of a ring. This proposal, however, has not eliminated the problem of partial emitter operation.

It is, therefore, an object of this invention substantially to eliminate partial emitter operation, and to provide a transistor capable of minority carrier injection over the complete area of the emitter-base region.

It is another object of this invention to provide a transistor having greatly improved power output capabilities as compared with similar prior art devices.

In accordance with an aspect of the invention, there is provided a transistor characterized in that the impurity concentration in the emitter, or base, or both, is so varied as to compensate for the voltage drop produced in the base region by the base current.

It will be apparent in the following description of the novel transistor that the gradient of the impurity concentration is present in a direction perpendicular to the flow of the minority carriers. It will also be apparent that the above-mentioned objects of the invention are attained by compensating the effect of a voltage drop within the base region caused by the flow of the base current. By so compensating for the voltage drop, the minority carriers will be injected uniformly from the entire boundary surface between the emitter and the base regions.

The above-mentioned and other features and objects of this invention and the manner of attaining them will become more apparent and the invention itself will be best understood by reference to the following description of an embodiment of the invention taken in conjunction with the accompanying drawings, wherein.

Figure 1:
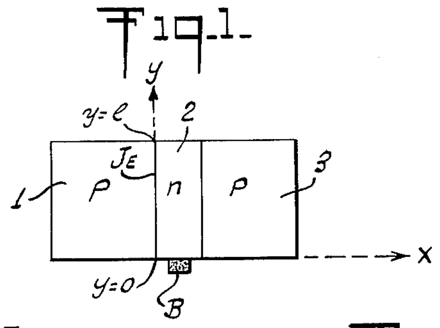
FIG. 1 is a diagram of a junction type transistor.

Referring first to FIG. 1, there is shown, by way of an example, a junction type transistor of p-n-p type having an emitter region 1, a base region 2, and a collector region 3. The direction of flow of the carriers is assumed along the $x$-axis and the direction perpendicular thereto as the $y$-axis. The points $y=0$ and $y=e$ defining the limits of "perpendicular" carrier flow are taken at the base terminal B, and at the opposite end of the base region 2, respectively. The principles of the invention shall be described with reference to FIGS. 1–4, the figures illustrating situations where the impurity gradients in the emitter region 1 and/or in the base region 2 are varied.

Figure 2:
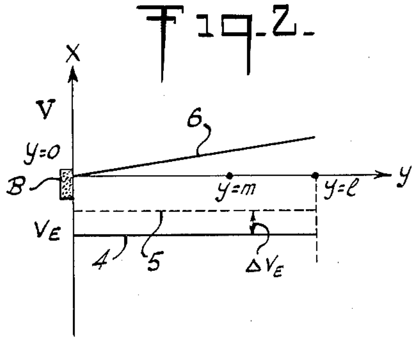
FIG. 2 is an internal voltage distribution curve along the emitter-base junction of a conventional p-n-p transistor.

In FIG. 2, the internal voltage distribution is shown along the $y$-axis of a conventional transistor having uniform concentrations of impurities in both of the emitter and base regions 1 and 2. The horizontal line 4 indicates the potential level $V_E$ at the emitter junction $J_E$ (FIG. 1) on the emitter side and in the absence of current flow. It will be understood that the potential of the base terminal B on the base region 2 is taken as zero. As is well known, the potential $V_E$ has a negative value and is given by the following equation:

$$V_E=kT/q.\ln\ (N_aN_d/n_i^2) \qquad (1)$$

where $q$ is the charge of an electron, $N_a$ and $N_d$ the concentrations of the impurity of the p- and n-type in the emitter region 1 and the base region 2, respectively, $k$ Boltzmann's constant, T absolute temperature, ln natural logarithm, and $n_i$ is the concentration of the intrinsic semi-conductor. In the equation, it is assumed that all donors and acceptors are ionized.

When a positive potential $\Delta V_E$ is impressed upon the emitter to cause the transistor to operate in the usual way, the potential shown by the straight line 4 is raised to a position indicated by the dotted line 5. With the injection of minority carriers from the emitter, base current will be produced. Inasmuch as the base current flows towards the base terminal B along the negative direction of the $y$-axis, a potential drop is produced in the base region 2. The potential at various points in the base region 2 due to this potential drop is indicated by the solid line 6.

The effective potential difference, therefore, along the emitter junction $J_E$ is the difference between the lines 5 and 6. Since the line 5 is relatively horizontal and the line 6 in inclined, it is apparent from FIG. 2 that somewhere along the line 6, the effective potential difference will be equal to the potential $V_E$, or the diffusion potential. This point is shown at $y=m$. The potential difference at this point is sufficient to prevent injection of minority carriers. No minority carrier injection will take place, therefore, between the points $y=m$ to $y=1$. Thus, the entire surface of the emitter is not utilized effectively and there is only partial emitter injection.

Figure 3:
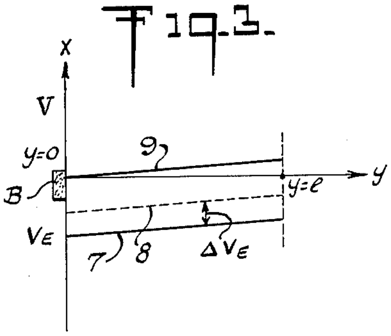
FIG. 3 is a curve similar to FIG. 2, but for a transistor constructed in accordance with the teachings of the invention.

FIG. 3 shows the potential distribution along the $y$-axis of a transistor constructed in accordance with the invention, wherein the concentration distribution in the emitter portion 1 is selected so as to increase in the negative direction of the $y$-axis (or decrease in the direction of the $y$-axis). As is evident from Equation 1, the line indicating the potential $V_E$ along the emitter junction $J_E$ on the emitter side is inclined as shown by line 7.

By applying a positive potential $\Delta V_E$ to the emitter 1, the potential on the emitter side of the junction $J_E$ is represented by a dotted line 8 and is parallel to the line 7. Again, a potential drop is produced in the base region 2 due to the flow of base current. The potential of the base region 2 along the emitter junction $J_E$ is shown by line 9. The difference in potential between the lines 8 and 9 is the effective potential along the emitter junction $J_E$. It is evident from the drawing that this voltage is substantially constant along the emitter junction $J_E$ covering the entire boundary surface of the emitter junction $J_E$ and that the minority carriers are injected from the entire boundary surface of the emitter portion 1.

Figure 4:
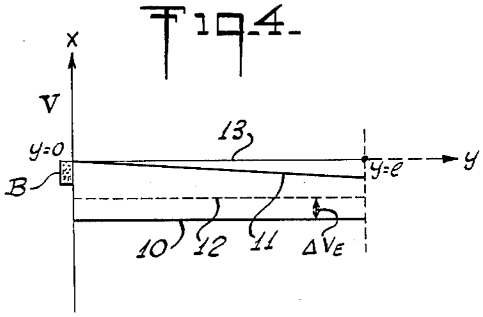
FIG. 4 is a curve similar to FIG. 3, but for another embodiment of the invention.

In FIG. 4 the concentration distribution diagram is shown for a transistor in which the base region 2 is varied in accordance with the invention. As in the previous example, the base region 2 around the base terminal B has the maximum impurity concentration, and the concentration decreasing gradually in the positive direction of the $y$-axis. The potential of the emitter junction $J_E$ on the emitter side and in the absence of a positive potential $\Delta V_E$ is shown by line 10. The potential line due to the base current is inclined in the direction of negative potential as shown by line 11.

If a positive voltage $\Delta V_E$ is impressed upon the emitter 1, the potential of the emitter junction $J_E$ on the emitter side will be raised as shown by the dotted line 12. In this case, the potential on the base side will shift from the inclined line 11 to a horizontal line 13 because of the voltage drop along the emitter junction $J_E$ caused by the base current. The potential actually applied to the emitter junction $J_E$, which is the difference between voltages shown by the lines 12 and 13 is, therefore, uniform along the emitter junction $J_E$ over the entire boundary surface. Accordingly, the minority carriers are injected from the entire boundary surface of the emitter portion 1.

It is evident that the concentrations in the emitter and base regions may be varied simultaneously so that the product $N_d$-$N_a$ may give a desired potential $V_E$ as shown by the Equation 1.

Figure 5:
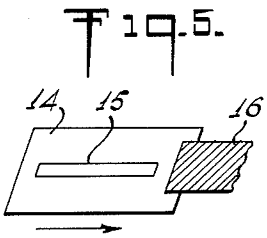
FIG. 5 is a schematic diagram of a crystal showing a useful portion for the base region.

A technique for making a transistor of this invention is to make a single crystal having a desired concentration gradient by the zone leveling or crystal pulling method, to cut out a pellet 14 shown in FIG. 5, and to form the emitter electrode 15, having the longer side in the direction shown by the arrow, by the alloying method. The arrow 16 shows the direction of the longer axis of the emitter electrode 15 along which the concentration in the pellet 14 gradually increases. The base lead terminal 16 is attached to the pellet 14 at the part where the concentration is the largest.

Figure 6:
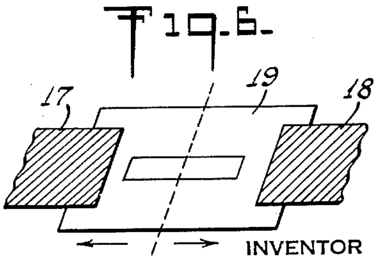
FIG. 6 is a diagram similar to FIG. 5 but for an alternative embodiment of the invention.

In the above-mentioned examples, it has been assumed that the concentration in the emitter portion 1 or the base region 2 is varied in only one direction. This variation in concentration may also take other forms. FIG. 6 shows an embodiment in which a pair of base electrodes are used at the opposite sides of the base region; e.g., at $y=0$ and $y=1$. In this embodiment, the concentration increases in two opposite directions as indicated by the two arrows from a central axis indicated by a dashed line. In this case, two lead terminals 17 and 18 are attached to the pellet 19.

While I have described above the principles of my invention in connection with specific apparatus, it is to be understood that this description is made only by way of example and not as a limitation of the scope of my invention as set forth in the objects thereof and in the accompanying claims.

What is claimed is:

1. A transistor comprising emitter, and base regions, and means for compensating for the voltage drop in the base region caused by the conduction of base current, said means constituting an impurity distribution gradient in at least one of said regions extending perpendicularly to the flow of minority carriers, the concentration gradually increasing in the direction of base current flow.

2. The transistor according to claim 1, wherein the concentration of impurity distribution is varied increasingly in the direction of base current flow in both of said regions.

3. The transistor according to claim 1, and further comprising a base electrode located on said base region and shaped so as to cause unidirectional flow of base current.

4. The transistor according to claim 1, and further comprising means for causing the base current to flow bilaterally in two opposite directions from the central portion of said base region, and at least one of said regions having an impurity distribution gradient gradually increasing from said central portion in the directions of said base current flow.

5. The transistor according to claim 4, wherein both said regions have a bilateral impurity distribution gradient.

References Cited in the file of this patent

UNITED STATES PATENTS

| | | |
|---|---|---|
| 2,810,870 | Hunter et al. | Oct. 22, 1957 |
| 2,817,613 | Mueller | Dec. 24, 1957 |
| 2,817,783 | Loebner | Dec. 24, 1957 |
| 2,878,152 | Runyan et al. | Mar. 17, 1959 |
| 2,895,058 | Pankove | July 14, 1959 |
| 2,964,689 | Buschert et al. | Dec. 13, 1960 |
| 2,968,751 | Mueller et al. | Jan. 17, 1961 |